United States Patent
Mujica et al.

(10) Patent No.: US 6,480,068 B1
(45) Date of Patent: Nov. 12, 2002

(54) HARDWARE ASSISTED AUTOMATIC GAIN CONTROL FOR DIGITAL SUBSCRIBER LINE MODEMS

(75) Inventors: Fernando A. Mujica, Allen, TX (US); Prakash Easwaran, Bangalore (IN); Sandeep Kesrimal Oswal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/966,055

(22) Filed: Sep. 28, 2001

(51) Int. Cl.[7] .................................................. H03G 3/10
(52) U.S. Cl. ........................ 330/279; 330/133; 330/134
(58) Field of Search ................................. 330/279, 133, 330/134, 129, 285

(56) References Cited

U.S. PATENT DOCUMENTS 4,377,946 A * 3/1983 Donato ........................ 73/457
4,827,351 A * 5/1989 Sakamoto .................... 358/284
5,117,201 A * 5/1992 Luther ......................... 330/279

* cited by examiner

Primary Examiner—Robert Pascal
Assistant Examiner—Henry Choe
(74) Attorney, Agent, or Firm—Pedro P. Hernandez; W. James Brady, III; Frederick J. Telecky, Jr.

(57) ABSTRACT

The present invention provides a hardware assisted automatic gain control (AGC) for a communication network. A dedicated hardware portion of the AGC, which works in cooperation with software implemented functionality (400), is included to detect saturation conditions in the internal nodes of the analog front end (200) in which a plurality of gain stages (PGA1, PGA2, PGA3) and filter stages (H1, H2, H3) are interleaved with inaccessible intermediate points. The saturation detection logic includes a comparator (21, 22, 23) and flip-flop (27, 28, 29) for each gain stage (PGA1, PGA2, PGA3) and can be integrated directly in the analog front end 200. The dedicated hardware can further be included in a codec of a modem in a digital subscriber line (DSL) system.

18 Claims, 2 Drawing Sheets

HARDWARE ASSISTED AUTOMATIC GAIN CONTROL FOR DIGITAL SUBSCRIBER LINE MODEMS

RELATED APPLICATIONS

Cross reference is made to commonly assigned U.S. patent application Ser. No. 09/966,054 entitled "Automatic Gain Control Method For Digital Subscriber Line Modems", the teaching of which being incorporated herein by reference and filed herewith.

BACKGROUND OF THE INVENTION

1. Technical Field of the Invention

The present invention relates generally to the field of telecommunications and, more particularly, to signal processing in subscriber line modems.

2. Description of the Related Art

The rapid increase in use and popularity of the Internet has motivated research and development of systems directed to advanced communication of information between remotely located computers, particularly in effecting higher bit-rates using existing infrastructure. One type of technology arising from this development is referred to in the art as digital subscriber line (DSL). DSL refers generically to a public network technology that delivers relatively high bandwidth over conventional telephone copper wiring at limited distances. DSL has been further separated into several different categories of technologies according to particular expected data transfer rate, the type and length of medium over which data is communicated, and the schemes for encoding and decoding the communicated data. A DSL system can be considered as a pair of communicating modems, one of which is located at a client site, such as a home or office computer, and the other of which is located at a network control site, typically a telephone central office.

One type of DSL technology is referred to as Asymmetric Digital Subscriber Line (ADSL) and corresponds to the ANSI standard T1.43. ADSL technology encompasses communication according to Discrete Multitone (DMT) modulation and also includes frequency domain multiplexing (FDM), other modulation techniques are also known in the art. ADSL systems can communicate data over a single copper twisted pair at downstream (central office to remote client) rates on the order of 100 times that of conventional voice band modem rates. For example, ADSL can utilize a downstream signal bandwidth of 25 kHz to 1100 kHz and an upstream signal bandwidth of 25 kHz to 138 kHz. Signal echo problems in this type of communication system are especially noticeable at the remote client modems, since its transmission bandwidth is within the bandwidth of its received traffic. Even in a FDM system, leakage of the upstream energy into the downstream band causes signal echo problems.

Because of the nature of ADSL communications, mixed signal circuitry is required in the implementation of ADSL modems, both for the central office and also for the remote clients in which both analog and digital signals are handled. Conventional ADSL modem designs include functions referred to as analog front ends in which operations such as digital-to-analog and analog-to-digital conversion, amplification/attenuation and filtering is performed. Because of the frequencies involved in ADSL technology, which can range from tens of kHz to MHz frequencies, and because of the large dynamic range required in order to accommodate the wide variations in length and schemes for subscriber loops, the amplification and filtering can be vary complex, particularly in an integrated circuit.

Analog amplification or attenuation is typically needed in the received path of most digital modems to fully utilize the available digital dynamic range. Typically, the gain adjustment depends on the particular channel conditions, therefore, automatic gain control is preferable. In cases where all the analog filtering is performed before all programmable gain attenuation/amplification (PGA) stage(s), the task of an automatic gain controller is greatly simplified as saturation conditions at the output of the filtering stages are readily observable in the digital domain. On the other hand, when the PGA and filtering stages are interleaved (typical in integrated analog front ends) the automatic gain controller problem is a difficult one since, in most environments, the intermediate points in the receive path are inaccessible.

Therefore, there is a need for an automatic gain control approach for digital subscriber line modems targeted to analog front end (AFE) designs with interleaved gain and filtering stages in which the intermediate points in the receive path are inaccessible.

SUMMARY OF THE INVENTION

The present invention achieves technical advantages as a method and system of hardware assisted automatic gain control (AGC) for a communication network. A dedicated hardware portion of the AGC, which works in cooperation with software implemented functionality, is included to detect saturation conditions in the internal nodes of the analog front end in which a plurality of gain stages and filter stages are interleaved with inaccessible intermediate points. The saturation detection logic includes a comparator and flip-flop for each gain stage and can be integrated after each gain stage directly in the analog front end. The dedicated hardware can further be included in a codec of a modem in a digital subscriber line (DSL) system.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
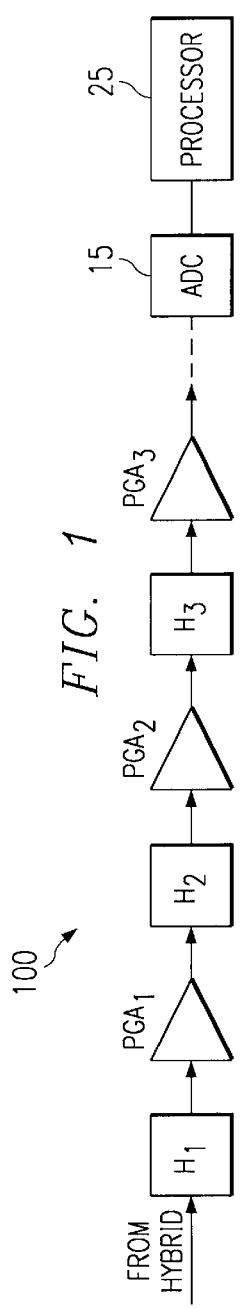
FIG. 1 illustrates a distributed filter and PGA stage arrangement for integrated analog front ends.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

The following embodiments of the present invention are directed to a hardware assisted AGC approach for digital modems, such as digital subscriber line (DSL) modems, with analog front end (AFE) designs where the gain and filtering stages are interleaved in which it is assumed that the intermediate points in the receive path are inaccessible. The present hardware assisted AGC approach can estimate out-of-band received energy and enable appropriate actions to minimize or eliminate AFE saturation. Throughout the drawings, it is noted that the same reference numerals or letters will be used to designate like or equivalent elements having the same function. A detailed description of known functions and constructions unnecessarily obscuring the subject matter of the present invention may be omitted for clarity.

Analog amplification or attenuation is typically needed in the received path of most digital modems to filly utilize the available digital dynamic range. Typically, the gain adjustment depends on the particular channel conditions, therefore, an automatic gain control (AGC) algorithm is preferable. Of particularly interested is the analog front end 100 type of distributed arrangement of filters and programmable gain amplifier (PGA) stages as depicted in FIG. 1. The arrangement of alternating filters (H1, H2 and H3) and PGAs (PGA1, PGA2 and PGA3) in a receive path from a hybrid circuit to a processor 25 is common in AFE designs where the intermediate points in the analog chain are inaccessible. Inventor: Inaccessible to what? Please explain. The arrangement generally includes a ADC 15. It is understood that other numbers of filters and PGAs are contemplated. One of the limitations of this structure is that saturation of the intermediate stages can be difficult to detect in the processor 25 because of the distributed filtering. For instance, such conditions occur for scenarios of poor echo rejection in the associated hybrid circuitry or in the presence of strong out-of-band interferers. In a DSL environment, disturbers can include RFI and HPNA signals.

Further, apart from addressing the difficult problem of avoiding out-of-band saturation conditions, the present approach simplifies a cooperative software portion of AGC. Although software-only AGC approaches, at the expense of processor resources, can handle most challenging scenarios, a hardware assisted AGC approach can simplify AGC implementation.

The present hardware assisted approach off loads the processor, such as a DSP 25, from the often difficult task of avoiding saturation at the intermediate stages in the AFE 100. For this purpose, saturation detection logic is included after each PGA stage directly in the AFE hardware.

Figure 2:
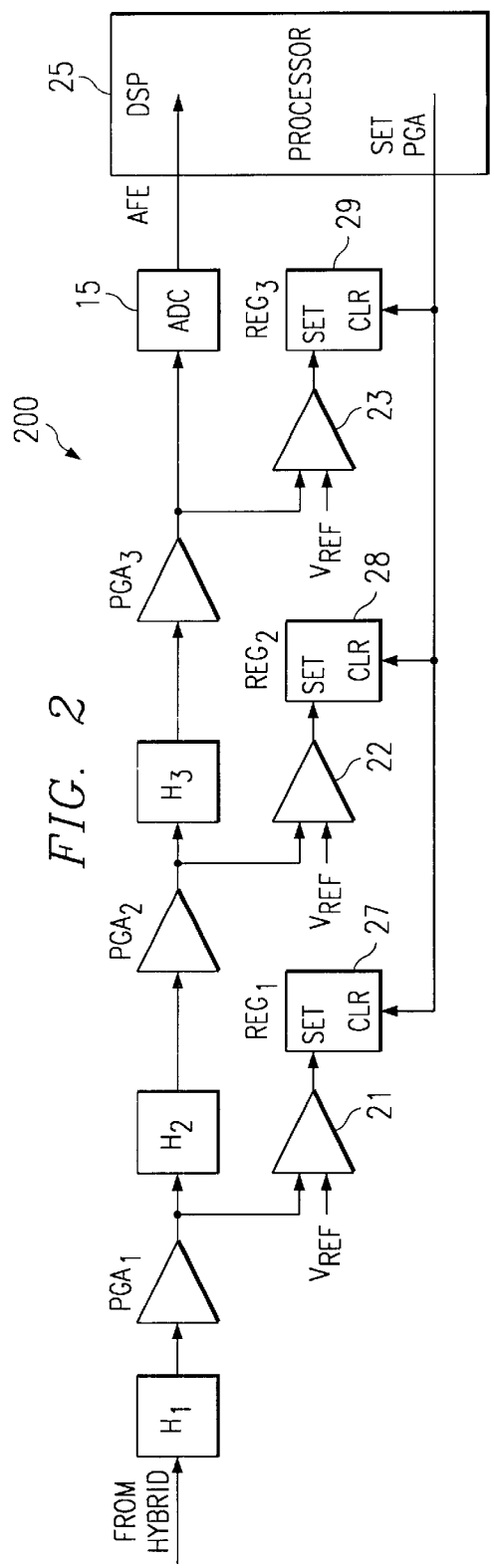
FIG. 2 illustrates an analog front end with hardware saturation detection logic incorporated with a distributed arrangement of filter and PGA stages in accordance with an exemplary embodiment of the present invention.

Referring now to FIG. 2 there is illustrated an AFE 200 with hardware saturation detection logic hardware incorporated with a distributed arrangement of filter and PGA stages in accordance with an exemplary embodiment of the present invention. Each stage of the logic includes a comparator (21, 22 and 23), a flip-flop (27, 28 and 29), and a voltage reference (Vref). Vref can be a variable or fixed reference. The comparator (21, 22, 23) has an input coupled to the PGA outlet and an input for the voltage reference. The output of the comparator (21, 22, 23) is coupled to drive the flip-flop (27,28,29). Alternatively, all the comparator (21, 22 and 23) outputs can be "anded" together to drive a single "saturation" flip-flop. For example, if only one "signal" is available to the processor 25, all the flip-flop outputs can be combined (anded).

In at least one embodiment, the status of the flip-flops (27, 28 and 29) is extracted by means of general purpose input/output (GPIO) pins. The status of the flip-flop can be notified to the processor 25 by shared memory, a common register, or any other interface. Flip-flop reset can be performed automatically after a PGA set command is issued leaving a guard time period to enable the PGAs to settle. The required timing is illustrated in FIG. 3.

Figure 3:
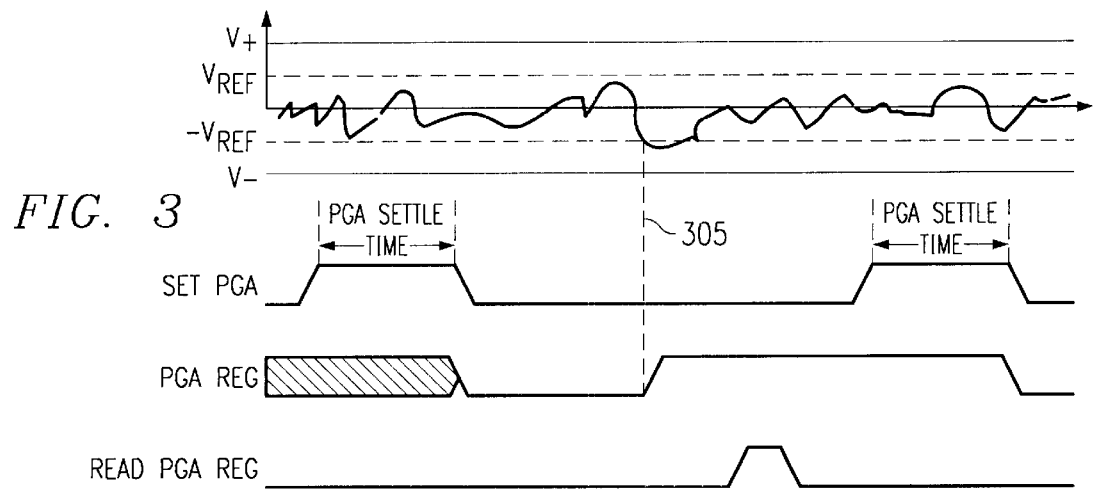
FIG. 3 illustrates a timing diagram for flip-flop reset in accordance with an exemplary embodiment of the present invention.

In FIG. 3, when the processor 25 sets the PGA to a different incremental gain setting, the flip-flop output (PGA Reg) is reset to an active low state after a fixed amount of time to guarantee that the PGA has settled to the desired gain. When the output to the PGA exceeds the threshold established by the reference, which is depicted in the figure as a dashed line 305, the flip-flop latches the event and its output becomes active high. The processor 25 checks the status of the flip-flop register by issuing a read command, this action is denoted by the Read PGA Reg signal.

Figure 4:
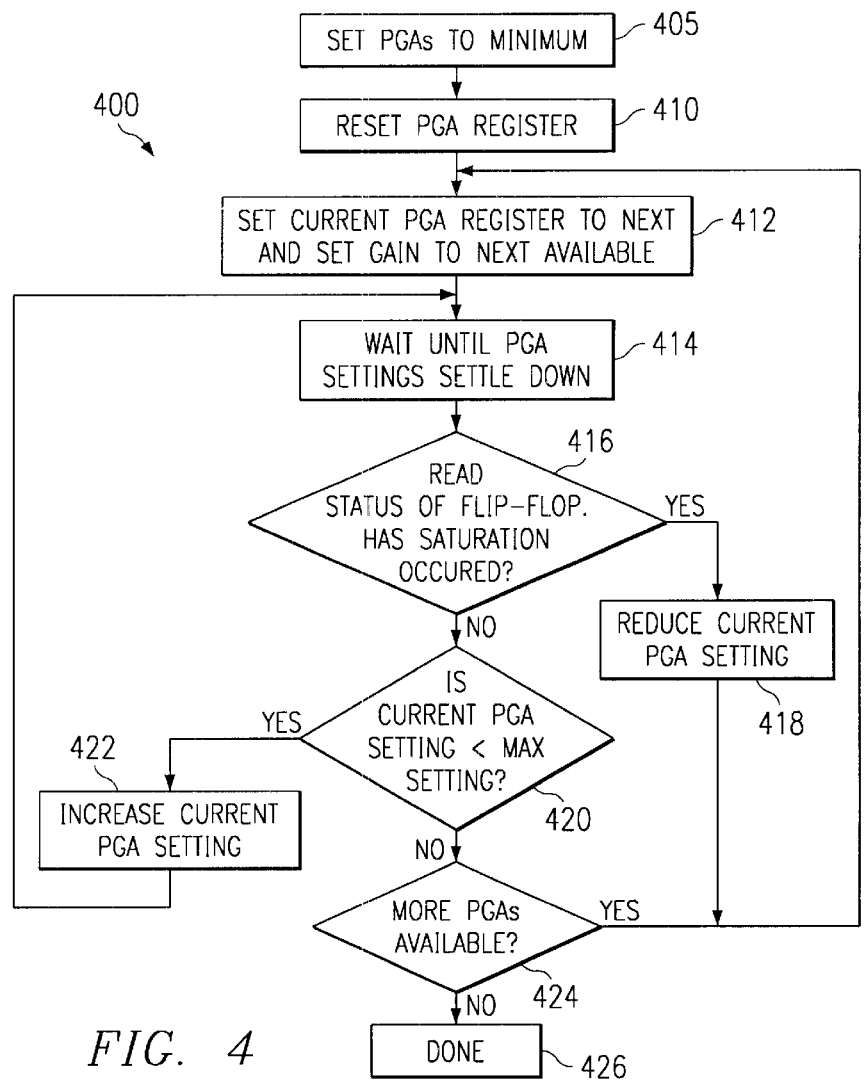
FIG. 4 illustrates a flow diagram of software implemented functionality cooperative with the hardware detection logic in accordance with an exemplary embodiment of the present invention.

Referring now to FIG. 4 there is illustrated a flow diagram of a method 400 cooperative with the above-described hardware detection logic in accordance with an exemplary embodiment of the present invention. The method can be software implemented functionality. Firstly, each of the PGAs are set to the respective minimal gain setting 405 and a PGA register is reset 410. The PGA register includes an order for which the PGA gain settings are determined. The order can be selected automatically or manually. For each PGA in the distributed arrangement, the PGA register is set to the next available PGA and the corresponding gain is set to the next available gain setting 412. The PGA then is given a predetermined period of time to settle down (which includes a time period so that the hardware can reliably detect a saturation condition) 414. This is a hardware dependent parameter which is typically related with settle time of analog components like op-amps.

Subsequently, the status of the "saturation" flip-flop corresponding to the current PGA is read to determine if saturation has occurred 416. If saturation has occurred, the current PGA gain setting is reduced by one 418 and control is passed to act 412. Otherwise, it is determined if the current PGA gain setting is lower than the maximum PGA setting 420. If it is lower, the gain setting is increased by one 422 and control is passed to act 414. If it is not lower, the next PGA is considered 424 by returning to act 412. If there are no more PGAs to consider, the process is complete 426. It should be noted that the above-described cooperative software implemented functionality can be executed as instructions by a processor such as a DSP 25.

When using programmable thresholds, appropriate values should be selected to account for the peak-to-average ratio (PAR) difference between the training signals and the signals used for regular modem operation (known as "showtime" signals in the DSL art).

A goal of the AGC is to increase the front-end gain (PGAs) so that the showtime signals do not saturate the receiver. Since the AGC is trained with a signal with a lower PAR, an appropriate headroom should be consider to accommodate the higher PAR showtime signals. This headroom is typically measured in dB with respect to the full swing of the analog component and represents an appropriate value to be used as a reference voltage.

Although a preferred embodiment of the apparatus and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A system adapted to select gain settings for a plurality of interleaved programmable gain amplifiers in a digital subscriber line system, comprising:

a plurality of comparators each having an input adapted to couple to a respective programmable gain amplifier output and operable to activate a signal when a saturation condition occurs on a respective programmable gain amplifier;

a plurality of indicator devices having an input adapted to couple to a respective comparator output and operable to latch a readable indicator when a saturation signal is detected; and a processor coupled to said plurality of indicator devices and operable to read said readable indicator, said processor further coupled to said plurality of programmable gain amplifiers and operable to select a gain setting for nonsaturation for each of said programmable gain amplifier.

2. The circuit of claim 1, wherein selecting said nonsaturation gain setting comprises selecting an incremental gain setting for each of said programmable gain amplifiers which is one incremental setting lower than a lowest incremental gain setting resulting in detection of a saturation condition.

3. The circuit of claim 1, wherein said indicator devices comprise flip-flops.

4. The circuit of claim 1, wherein said plurality of comparators and said plurality of indicator devices are integrated into an integrated circuit with said interleaved programmable gain amplifier.

5. The circuit of claim 1, wherein said comparators further adapted to receive a voltage reference signal for comparing said programmable gain amplifier output for determining said saturation condition.

6. The circuit of claim 1, wherein said processor comprises a digital signal processor.

7. An analog front end for a modem, comprising:

a plurality of serially coupled amplification stages, wherein each of said amplification stages has a plurality of incremental gain settings;

a plurality of comparators each having an input adapted to couple to a respective amplification stage output and operable to activate a signal when a saturation condition occurs on said respective amplification stage output; and a plurality of indicator devices each having an input adapted to coupled to a respective comparator output and operable to latch a readable indicator when a saturation signal is detected.

8. The analog front end of claim 7 further comprising a plurality of signal filters interleaved with said plurality of serially coupled amplification stages.

9. The analog front end of claim 8 integrated into an integrated circuit.

10. The analog front end of claim 7, wherein each of said comparators further adapted to receive a voltage reference signal for comparing said amplification output for determining a saturation condition occurrence.

11. The analog front end of claim 7, wherein each of said amplification stages comprises a programmable gain amplifier.

12. The analog front end of claim 11 further comprising a plurality of signal filters interleaved with said plurality of serially coupled programmable gain amplifiers.

13. The analog front end of claim 12 integrated into an integrated circuit.

14. A method for selecting gain settings for a plurality of interleaved programmable gain amplifiers in a digital subscriber line system, comprising the sequential acts of:

resetting a gain stage register;

initiating each of said programmable gain amplifiers to respective minimal gain settings, wherein each programmable gain amplifier has a plurality of incremental gain settings; and determining a highest nonsaturation incremental gain settings for each of said programmable gain amplifiers in an order defined by said gain stage register.

15. The method of claim 14, wherein said determining a highest nonsaturation incremental gain setting further includes selecting an incremental gain settings for each of said programmable gain amplifiers which is one setting below a lowest gain setting resulting in detection of a saturation condition on a respective programmable gain amplifier.

16. The method of claim 15, wherein detection of a saturation condition is enabled in hardware.

17. The method of claim 14, wherein said determining a highest nonsaturation incremental gain setting further includes:

increasing a gain setting by one increment for a current programmable gain amplifier;

reading a status of a saturation detection device associated with said current programmable gain amplifier; and if said saturation detection device status indicates a saturation condition occurred;
      reducing said current programmable gain amplifier setting by one increment and proceed to a next programmable gain amplifier;
   otherwise increase said current programmable gain amplifier setting by one increment and return to said act of reading.

18. The method of claim 17, wherein said saturated detection device comprises a flip-flop circuit.

* * * * *